United States Patent
Solomon et al.

(10) Patent No.: US 6,437,422 B1
(45) Date of Patent: Aug. 20, 2002

(54) ACTIVE DEVICES USING THREADS

(75) Inventors: Paul M. Solomon, Yorktown Heights, NY (US); Jane Margaret Shaw, Branford, CT (US); Cherie R. Kagan, Ossining, NY (US); Christos Dimitrios Dimitrakopoulos, West Harrison, NY (US); Tak Hung Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/852,078

(22) Filed: May 9, 2001

(51) Int. Cl.$^7$ ............................................... H01L 29/06
(52) U.S. Cl. ......................................... 257/618; 257/40
(58) Field of Search .................... 257/618, 40; 428/383; 357/25

(56) References Cited

U.S. PATENT DOCUMENTS

| | | | |
|---|---|---|---|
| 5,347,144 A | * | 9/1994 | Garnier et al. ................. 257/40 |
| 6,180,956 B1 | | 1/2001 | Condroudis et al. |
| 6,242,097 B1 | * | 6/2001 | Nishiguchi et al. ......... 428/383 |
| 6,278,127 B1 | * | 8/2001 | Dodabalapur et al. ........ 257/40 |
| 6,339,227 B1 | * | 1/2002 | Ellenbogen ................... 257/40 |

* cited by examiner

*Primary Examiner*—Hoai Ho
*Assistant Examiner*—Thinh Nguyen
(74) *Attorney, Agent, or Firm*—Ohlandt, Greeley, Ruggiero & Perle, L.L.P.; Marian Underweiser

(57) ABSTRACT

Active devices that have either a thread or a ribbon geometry. The thread geometry includes single thread active devices and multiple thread devices. Single thread devices have a central core that may contain different materials depending upon whether the active device is responsive to electrical, light, mechanical, heat, or chemical energy. Single thread active devices include FETs, electro-optical devices, stress transducers, and the like. The active devices include a semiconductor body that for the single thread devices is a layer about the core of the thread. For the multiple thread devices, the semiconductor body is either a layer on one or more of the threads or an elongated body disposed between two of the threads. For example, a FET is formed of three threads, one of which carries a gate insulator layer and a semiconductor layer and the other two of which are electrically conductive and serve as the source and drain. The substrates or threads are preferably flexible and can be formed in a fabric.

61 Claims, 6 Drawing Sheets

ACTIVE DEVICES USING THREADS

FIELD OF THE INVENTION

This invention relates to active devices and, more particularly to active devices formed with threads.

BACKGROUND OF THE INVENTION

Active devices generally have electrical impedance between two electrodes that varies as a function of a change of energy. For example, active devices include transistors, diodes, strain gauges, electrical optical devices and the like. One form of transistor is the well-known field effect transistor (FET). One known FET is a metal oxide semiconductor FET(MOSFET), which has been widely used as a switching element for high-speed electronic applications. The MOSFET specifically refers to $SiO_2$/bulk silicon transistors. A more general FET is a metal insulator semiconductor FET (MISFET). A thin film transistor (TFT) is a MISFET in which the active semiconductor material is deposited as a thin film.

It is known to fabricate active devices with either crystalline silicon or amorphous silicon. Amorphous silicon is a cheaper alternative to crystalline silicon, but its applications are limited to slower speed devices as its mobility is about $10^{-1}$ $cm^2/N*sec$, which is about 15,000 times smaller than that of crystalline silicon.

Currently, there is much work directed to developing alternative materials, such as organic and organic-inorganic semiconductor materials that may be deposited by low cost and low temperature processes. Lower processing costs may lead to low cost logic and display devices. Lower temperature processing opens up the possibility of depositing these materials on a wider range of substrates, including plastic, paper and fabrics for flexible electronic devices.

An example of a FET made with organic materials is disclosed in U.S. Pat. No. 5,347,144 to Garnier et al., entitled "Thin-Layer Field Effect Transistors With MIS Structure Whose Insulator and Semiconductor Are Made of Organic Materials." Organic materials may provide a less expensive alternative to inorganic materials for TFT structures, as they are cheaper to manufacture by methods, such as spin coating or dip coating from solution, thermal evaporation, or screen printing. Such organic materials include small molecules (e.g., pentacene, metal-phthalocyanines and the like), short-chain oligomers (e.g., n-thiophenes, where n=3–8 thiophene units) and polymers (e.g., polyalkylthiophenes, poly-phenylenevinylenes and the like).

An example of a FET made with organic-inorganic materials is described in U.S. Pat. No. 6,180,956 to Chondroudis et al., entitled "Thin Film Transistors With Organic-Inorganic Hybrid Materials as Semiconducting Channels." Again, TFTs made with organic-inorganic materials can use the cheaper manufacturing processes, such as spin coating or dip coating from solution, thermal evaporation, or screen printing.

Conventional active devices are generally formed on planar substrates. Thus, current efforts to make flexible devices are focussed on deposition of the semiconductor devices on large area flexible substrates. These efforts have not yet provided a commercial flexible electronic device.

Accordingly, there is a need for an active device that can be fabricated with low cost and low temperature processing.

There is also a need for an assembly of and a method for forming a plurality of active devices on a flexible substrate.

There is also a need for a method of forming a large area assembly of such active devices.

SUMMARY OF THE INVENTION

An active device of the present invention is formed of a thread with a semiconductor body extending axially along the thread. First and second electrical conductors extend axially along the thread and are disposed in electrical contact at spaced apart locations with the semiconductor body. The carrier concentration in the semiconductor body varies with energy that affects the thread, thereby also varying the impedance between the first and second electrical conductors.

According to an aspect of the invention, the thread has an optical fiber core upon which the semiconductor body is disposed and the energy is light energy. According to another aspect of the invention, the thread has a piezo-electric core upon which the semiconductor body is disposed and the energy is mechanical. According to another aspect of the invention, the thread has an electrically conductive core with a layer of electrical insulation upon which the semiconductor body is disposed and the energy is electrical. According to further aspects of the present invention, the energy can be heat or chemical with a suitable core.

According to other aspects of the invention, the active device is formed of a plurality of threads and the semiconductor body that extends axially of one of the threads. Two of the threads are electrically conductive and a third thread is responsive to applied energy to modulate the carrier concentration of the semiconductor body. The third thread can have either an optical fiber core or an electrically conductive core. The semiconductor body can be either a layer that is disposed on the third thread or an elongated body that is disposed in a region between the three threads. When the third thread has an electrically conductive core with a layer of electrical insulation, the active device is a field effect transistor. In these devices current flow is in a path that includes the first and third threads and the semiconductor body. That is, current flow is perpendicular or radial with respect to the axes of the first and second threads.

The threads used to form the various active devices of the present invention are formed of one or more filaments that are flexible or bendable. Thus, the need for a flexible substrate and flexible active device is met by the present invention.

The semiconductor body includes a semiconductor that can be disposed on a thread core that has a layer of electrical insulation disposed thereon, or that is an optical fiber or a piezo-electric material. Preferably, the semiconductor body includes an organic semiconductor or a hybrid organic/inorganic semiconductor or other semiconductor types that can be formed on the thread cores with low cost and low temperature processes, such as spin coating or dip coating from solution, thermal evaporation, or screen printing. Thus, the active devices of the present invention can be made with low cost and low temperature processes, thereby satisfying the aforementioned needs.

According to still another aspect of the present invention, an electrical circuit includes a plurality of threads and at least one semiconductor body with the threads forming two or more active devices. In some of these embodiments, each thread is an active device. In other embodiments, two or more active devices can share an electrically conductive thread.

According to still further aspects of the present invention, a fabric includes a plurality of threads in which at least one of the threads forms an active device.

BRIEF DESCRIPTION OF THE DRAWINGS

Other and further objects, advantages and features of the present invention will be understood by reference to the following specification in conjunction with the accompanying drawings, in which like reference characters denote like elements of structure and.

DESCRIPTION OF THE PREFERRED EMBODIMENT

Figure 1:
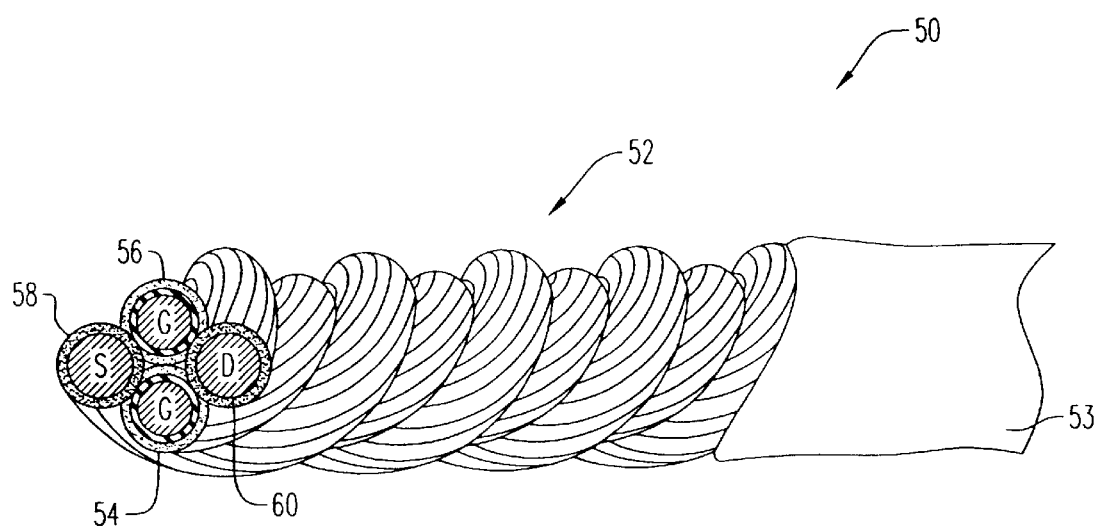
FIG. 1 is a perspective view of a segment of an active field effect transistor of the present invention.
Figure 2:
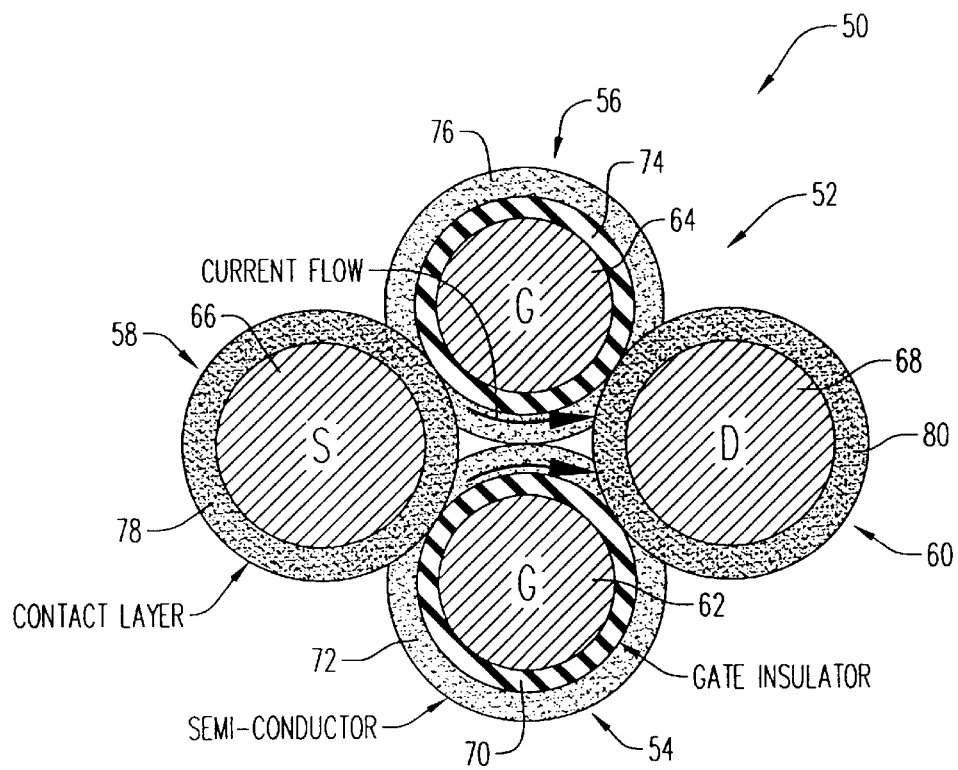
FIG. 2 is a blown up cross-sectional view of FIG. 1.

Referring to FIGS. 1 and 2, a FET 50 includes a sheath 53, a bundle 52 of threads 54, 56, 58 and 60. Threads 54 and 56 form a pair of gates of FET 50 and threads 58 and 60 form the source and drain, respectively, of FET 50. Gate thread 54 has a core 62 and gate thread 56 has a core 64. Source thread 58 has a core 66 and drain thread 60 has a core 68. Sheath 53 may be any suitable electrically insulative material, known currently or in the future. Sheath 53 is omitted from FIG. 2. Cores 62, 64, 66 and 68 comprise one or more filaments of an electrically conductive and flexible material, such as a metal or a conductive polymer. Alternatively, the filaments may be a non-conductive plastic with a coating of electrically conductive material, such as metal or conductive plastic. The filaments may be solid or hollow and may have any suitable cross-section, symmetrical, asymmetrical, curved or uncurved or any combination thereof.

Gate thread 54 includes a layer 70 of insulator material disposed adjacent to core 62 and a layer 72 of semiconductor material disposed adjacent to insulator layer 70. Gate thread 56 includes a layer 74 of insulator material disposed adjacent to core 64 and a layer 76 of semiconductor material disposed adjacent to insulator layer 74. Source thread 58 includes a contact layer 78 disposed adjacent to core 66 and drain thread 60 includes a contact layer 80 disposed adjacent to core 68. Contact layers 76 and 78 are disposed in electrical contact with semiconductor layers 70 and 72 and function to enhance carrier mobility at the interfaces of electrical contact with semiconductor layers 72 and 76.

Semiconductor layers 72 and 76 and contact layers 78 and 80 may be any suitable organic, inorganic, or hybrid semiconductor material that can be disposed on the core material, known presently or in the future. Organic semiconductors include, for example, semiconducting small molecules, oligomers and polymers. For, example, semiconductor layers 72 and 76 may be formed with organic semiconductors, such as polythiophene derivatives, oligothiophene derivatives and pentacene. A hybrid semiconductor, for example, may be phenethyl ammonium tin iodide. Contact layers 78 and 80 may be formed of highly conductive materials, such as doped semiconductors, metallic hybrids, or metals, such as Au, Cu, Mg, Ca, and the like. The doped semiconductors include, for example, polythiophene with iodine, polyaniline with camphor sulfonic acid, polyacetylene, polypyrrole, and the like. These materials may be applied by any suitable process, such as electrodeposition, electroless plating, extrusion, spraying, stamping, molding, powder coating, melting, spin coating, and the like.

Gate insulation layers 70 and 74 may be any suitable electrical insulation material that can be used for FETs, known presently or in the future. For example, the insulation material may be organic insulators, such as polymethylmethacrylate (PMMA), polyimide, epoxies, and the like; inorganic insulators, such as silicon dioxide, silicon nitride, barium strontium titanates, and the like; or organic/inorganic hybrids, such as sol gel and silicates. Gate insulation layers 70 and 74 may be applied to cores 62 and 64 by any suitable process, such as electrodeposition, electroless plating, extrusion, spraying, stamping, molding, powder coating, melting, spin coating, and the like.

Current flow in FET 50 is from thread to thread. For example, current flow is in a path that includes source thread 58, semiconductor layers 72 and 76 of threads 54 and 56 and drain thread 60. That is, current flow is perpendicular or radial with respect to the axes of the source and drain threads 58 and 60.

FET 50 has a width that is in the length direction of bundle 52. The width depends on the application. For example, if FET 50 were embedded in a five inch shirt pocket of a garment, the width would be about five inches. If the power rating is about 10mW, (suitable for activating a light emitting diode) and the current rating is about 1mA, FET 50 would have a width of about 12 cm (the length of the pocket) and a thread diameter in the range of about 10 microns to about 100 microns.

Gate threads 54 and 56, source thread 58 and drain thread 60 are twisted together in bundle 52 so as to impart a mechanical force to hold them together in a manner that assures good electrical contact at the interfaces of source thread 58 and drain thread 60 with semiconductor layers 72 and 76. Other techniques may be used to impart the necessary mechanical force, such as ties, a sleeve, a sheath and the like. The sheath 53 also prevents shorting between threads.

Because of its flexibility and thread geometry, FET 50 has the significant capability of integration into a woven fabric. Due to the large width of FET 50, its current rating can be high enough to drive substantial loads, even with low mobility organic semiconductor layers 72 and 76.

In a specific example of FET 50, gate cores 62 and 64 are each copper wires with a diameter of about 25 microns. Gate insulator layers 72 and 74 are enamel coatings of about 0.5 micron thickness. Semiconductor layers 72 and 76 are formed by dipping the enamel coated wires in a solution of an organic semiconductor dissolved in chloroform and then removing and drying. The organic semiconductor is regioregular poly-3-hexyl-thiophene (P3HT).

The source and drain cores 58 and 60 are also copper wires with a diameter of about 25 microns that are coated with chromium to prevent corrosion. Contact layers 78 and 80 are formed by dipping the wires in P3HT solution that has been doped with Ferric Chloride. The contact layer thickness is about 0.2 microns.

Gate threads 54 and 56, source thread 58 and drain thread 60 are each wound on spools. Gate threads 54 and 56, source thread 58 and drain thread 60 are then unspooled and wound together to form the twisted thread structure of FIG. 1. Sheath 53 is then formed by dipping the twisted threads in a solution of PMMA dissolved in acetone, which does not affect semiconductor layers 72, 76, 78 and 80.

Figure 3:
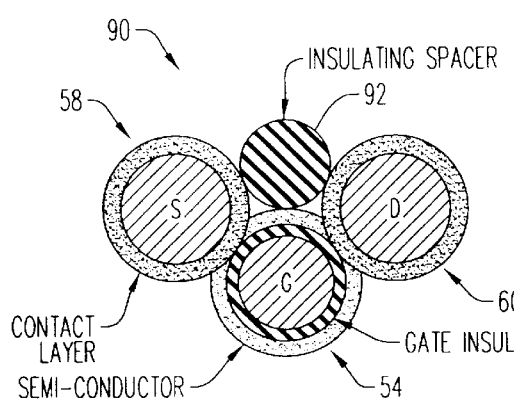
FIGS. 3–7 are cross-sectional views of alternative field effect transistors of the present invention.

Referring to FIG. 3, a FET 90 is substantially the same as FET 50, except that gate thread 56 is replaced with a spacer thread 92. Spacer thread 92 may comprise a single filament or multiple filaments of an electrical insulation material, such as nylon, PMMA, polyvinylchloride (PVC), polyesters, and the like. The filaments may be solid or hollow and may have any suitable cross-section. Insulation thread 92 keeps source thread 58 and drain thread 60 separated so that they do not contact one another. Like FET 50, FET 90 has a mechanical force imparted to gate thread 54, source thread 58, drain thread 60 and insulation thread 92 to hold them together as a bundle in a manner that keeps source thread 58 and drain thread 60 separated.

Figure 4:
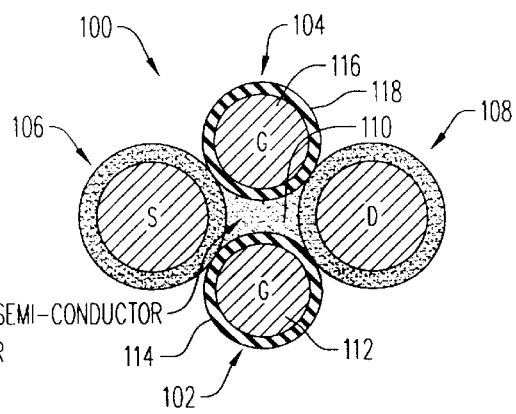

Referring to FIG. 4, a FET 100 has a gate thread 102, a gate thread 104, a source thread 106, a drain thread 108 and a semiconductor body 110. Source thread 106 and drain thread 108 are substantially identical to source thread 58 and drain thread 60 of FET 50 of FIGS. 1 and 2. Gate thread 102 has a core 112 upon which is disposed an insulator layer 114. Gate thread 104 has a core 116 upon which is disposed an insulator layer 118. Cores 1 112 and 116 are substantially identical to cores 62 and 64 of FET 50 of FIGS. 1 and 2. Insulation layers 114 and 118 are substantially identical to insulation layers 70 and 74 of FET 50 of FIGS. 1 and 2. Semiconductor body 110 has an elongated shape and is disposed in the space or void between threads 102, 104,106 and 108. Like FET 50, FET 100 has a mechanical force imparted to gate threads 102 and 104, source thread 106, drain thread 108 and semiconductor thread 110 to hold them together as a bundle in a manner that keeps source thread 58 and drain thread 60 separated.

Semiconductor body 110 may be fabricated of any suitable semiconductor material that is formable in an elongated threadlike shape and that has a pliability that adjusts to the surfaces of gate threads 102 and 104, source thread 106 and drain thread 108 when a mechanical force is applied. For example, semiconductor body 110 may be formed of a permeable thread that is saturated with an organic semiconductor, such as P3HT or of a hybrid organic/inorganic semiconductor, such as phenephyl ammonium tin iodide.

Alternatively, semiconductor body 110 may be formed of a semiconductor paste or gel that is applied to the surface of one or more of the threads 102, 104, 106 and 108 in an amount sufficient to provide a continuous body therebetween. For example, the semiconductor paste may be formed of an organic semiconductor combined with a binder chosen for its mechanical properties, such as toughness, strength, pliability, adhesive and thermal properties. The binder, for example, may be polystyrene.

Figure 5:
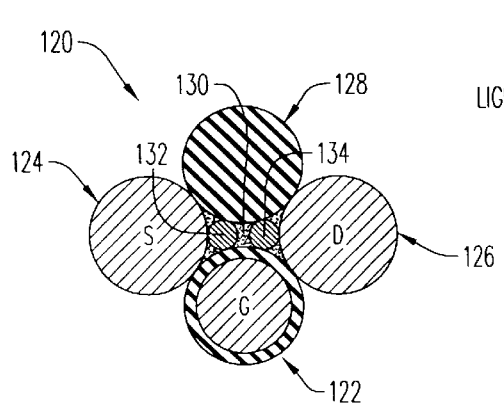

Referring to FIG. 5, a FET 120 includes a gate thread 122, a source thread 124, a drain thread 126, a spacer thread 128, a semiconductor body 130 and a pair of contact threads 132 and 134. Gate thread 122 is substantially identical to gate thread 102 of FET of FET 100 in FIG. 4. Spacer thread 128 is substantially identical to spacer thread 92 of FIG. 3. Semiconductor body 130 is substantially identical to semiconductor body 110 of FET 100 of FIG. 4. Source thread 124 and drain thread 126 are each formed of one or more filaments of an electrically conductive and flexible material, such as a metal or a conductive polymer. Alternatively, the filaments may be a non-conductive plastic with a coating of electrically conductive material, such as metal or conductive plastic. The filaments may be solid or hollow and may have any suitable cross-section.

Contact thread 132 is disposed in electrical contact with semiconductor thread 110 and in electrical contact with source thread 124. Contact thread 134 is disposed in electrical contact with semiconductor thread 130 and drain thread 126. Contact threads 132 and 134 are formed with any suitable semiconductor material that enhances carrier mobility at the interfaces to semiconductor thread 130. For example, contact threads 132 and 134 may be formed of a doped semiconductor through controlled diffusion of a dopant from the source and drain.

It will be appreciated by those skilled in the art that the contact thread arrangement of FET 120 can be used in place of the contact layer arrangement of FETs 50, 90 and 100. For example, contact layers 78 and 80 of source and drain threads 58 and 60 of FET 50 (FIGS. 1 and 2) can be replaced by a pair of spaced apart contact threads that are in electrical contact with semiconductor layers 72 and 76 and with source and drain cores 66 and 68.

In a specific example of FET 120, semiconductor body 130 is formed by soaking a permeable thread, which may be formed of multiple filaments, in P3HT dissolved in chloroform solution, withdrawing and drying. Contact threads 132 and 134 may be a high function Pd coated copper. Contact threads 132 and 134 with semiconductor body therebetween are fused to form a three thread assembly and spooled. The three thread assembly is then dipped in a solution of P3HT dissolved in chloroform, and, while still wet, wound with spacer thread 128, source thread 124 and drain thread 126 to harden in position and form FET 120.

Figure 6:
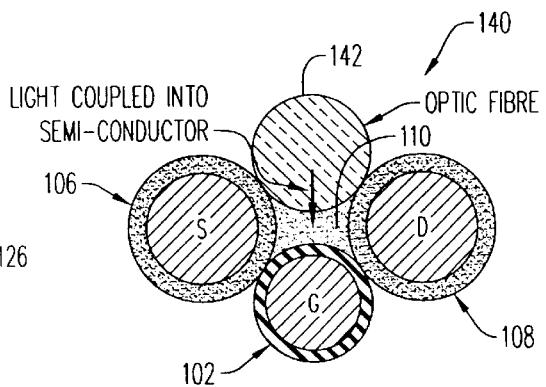

Referring to FIG. 6, a FET 140 is substantially identical to FET 100 of FIG. 4, except that an optical thread 142 replaces gate thread 104. Alternatively, optical thread 142 may replace both gate threads 102 and 104. Optical thread 142 is an optical fiber that is disposed adjacent to semiconductor body 110 and between source thread 106 and drain thread 108. Optical energy applied to optical thread 142 is coupled into semiconductor body 110 and modulates the carrier concentration therein so as to cause a change in the impedance thereof between the source thread 106 and the drain thread 108.

Figure 7:
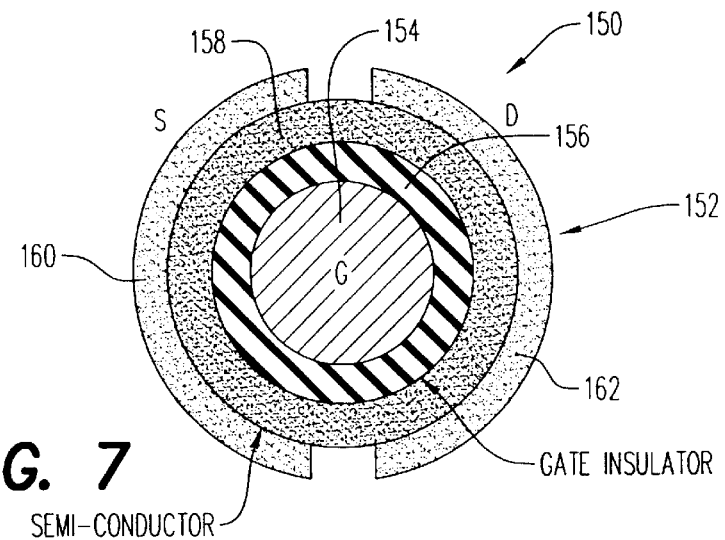

Referring to FIG. 7, a FET 150 has a single thread 152. Thread 152 has a core 154, an insulating layer 156, a semiconductor layer 158, a source layer 160 and a drain layer 162. Core 154 comprises one or more filaments of an electrically conductive and flexible material, such as a metal or a conductive polymer. Alternatively, the filaments may be a non-conductive plastic with a coating of an electrically conductive material, such as metal or conductive plastic. The filaments may be solid or hollow and may have any suitable cross-section. Insulating layer 156 is disposed on the surface of core 154 and semiconductor layer 158 is disposed on the surface of insulating layer 156. Source layer 160 and drain layer 162 are disposed on the surface of semiconductor layer 158 as stripes along the length or axial direction of thread 152.

Figure 8:
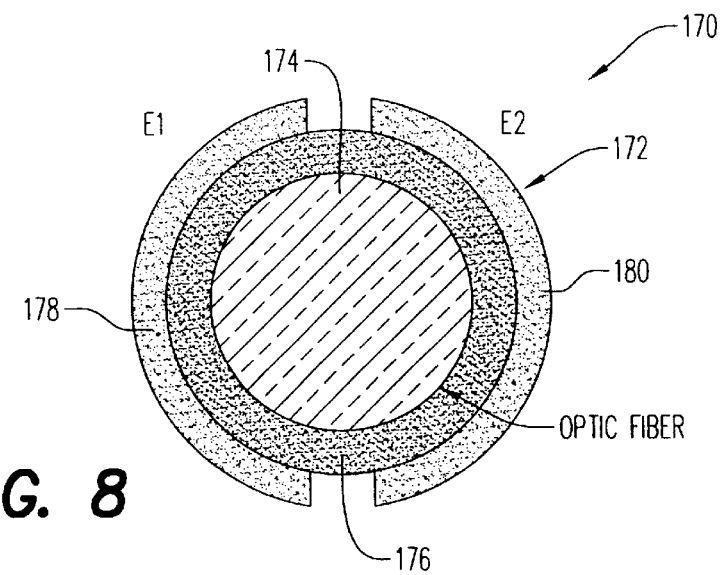
FIG. 8 is a cross-sectional view of an active device of the present invention.

Referring to FIG. 8, an active device 170 has a single thread 172. Thread 172 has a core 174, a semiconductor layer 176, and a pair of electrodes 178 and 180. Core 174 is comprised of an optical fiber. Semiconductor layer 176 is disposed on the surface of optical fiber core 174. Electrodes 178 and 180 are disposed on the surface of semiconductor layer 176 as stripes along the length or axial direction of thread 172. Optical energy applied to optical fiber core 174 modulates the carrier concentration in semiconductor layer 176 and, hence, varies the impedance between electrodes 178 and 180. An important application of active device 170 is to convert light energy to electrical energy.

Figure 9:
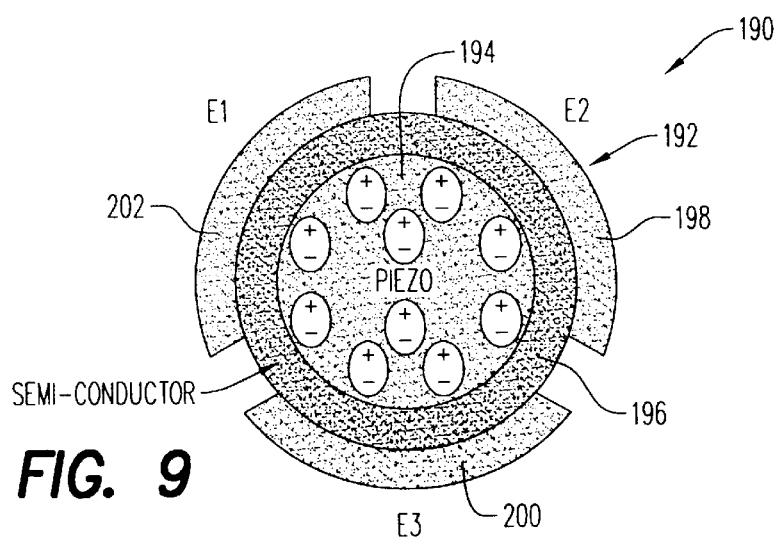
FIG. 9 is a cross-sectional view of an alternative active device of the present invention.

Referring to FIG. 9, an active device 190 has a single thread 192. Thread 192 has a core 194, a semiconductor layer 196, and three electrodes 198, 200 and 202. Core 194 is comprised of a piezo-electric material. Semiconductor layer 196 is disposed on the surface of piezo-electric core 194. Electrodes 198, 200 and 202 are disposed on the surface of semiconductor layer 196 as stripes along the length or axial direction of thread 192. Mechanical stress applied to piezo-electric core 194 modulates the carrier concentration in semiconductor layer 196 and, hence, varies the impedance between electrode 198 and electrodes 200 and 202 and between electrodes 200 and 202. An important application of active device 190 is to convert mechanical energy to electrical energy.

The optical fiber 174 of active device 170 or the piezo-electric core 194 of active device 190 can be replaced by with other suitable materials for the conversion of heat energy or chemical energy to electrical energy. It is also possible to use light, mechanical stress, heat or chemical energy to generate electrical power that could replace batteries in low power applications.

Figure 10:
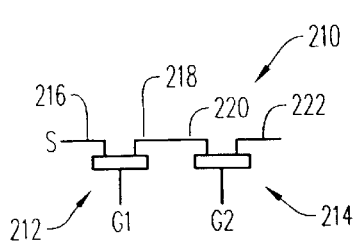
FIG. 10 is a diagram of a prior art circuit.

Referring to FIG. 10, a prior art FET circuit 210 includes a pair of FETs 212 and 214. FET 212 has a gate G1, a source 216 and a drain 218. FET 214 has a gate G2, a source 220 and a drain 222. FETs 212 and 214 have their source/drain channels connected in series, i.e., source 218 is connected to drain 220.

Figure 11:
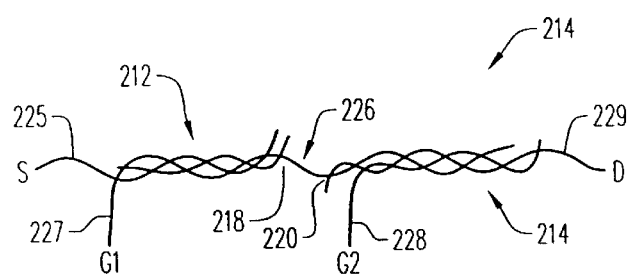
FIG. 11 is an assembly of the present invention for the FETs of FIG. 10.

Referring to FIG. 11, circuit 210 is shown in a thread assembly 224. FET 212 is formed with a source thread 225., a gate thread 227 and a common thread 226. FET 214 is formed with a gate thread 228, a drain thread 229 and common thread 226. Thus, gates G1 and G2 are implemented with gate threads 227 and 229; source 216, with source thread 225; drain 222, with drain thread 229; and drain 218 and source 220, with common thread 226.

Figure 12:
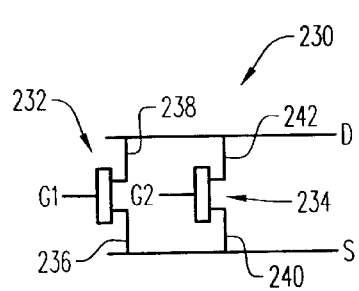
FIG. 12 is a diagram of a prior art circuit.

Referring to FIG. 12, a prior art circuit 230 includes two FETs 232 and 234. FET 232 has a gate G1, a source 236 and a drain 238. FET 234 has a gate G2, a source 240 and a drain 242. FETs 232 and 234 have their source/drain channels connected in parallel, i.e., source 236 is connected to source 240 and drain 238 is connected to drain 242.

Figure 13:
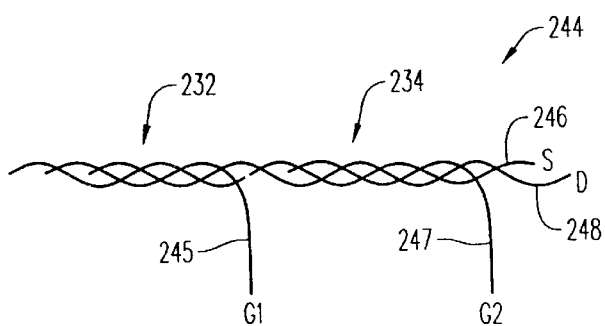
FIG. 13 is an assembly of the present invention for the FETs of FIG. 12.

Referring to FIG. 13, circuit 230 is shown in a thread assembly 224. FETs 232 and 234 are formed with a common source thread 246 and a common drain thread 248 and with separate gate threads 245 and 247. Thus sources 236 and 240 (FIG. 12) are implemented with common source thread 246; drains 238 and 242 (FIG. 12), with common drain thread 248; and gates G1 and G2, with gate threads 245 and 247.

Figure 14:
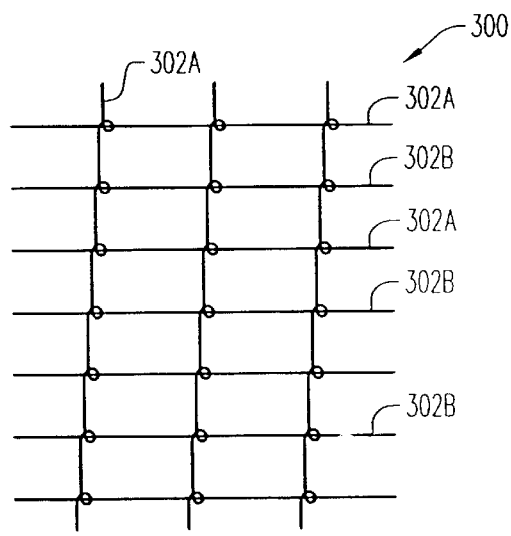
FIG. 14 depicts a fabric that contains active device threads of the present invention.

Referring to FIG. 14, a fabric 300 has a plurality of threads 302A and 302B that are woven together. Threads 302A are cloth threads and threads 302B are active device threads, such as FETs 50, 90, 100, 120 or 140 or active devices 150, 170 or 190. Applications for fabric 300 include any application in which an electrical, optical, mechanical stress, heat, or chemical activity is needed.

Figure 15:
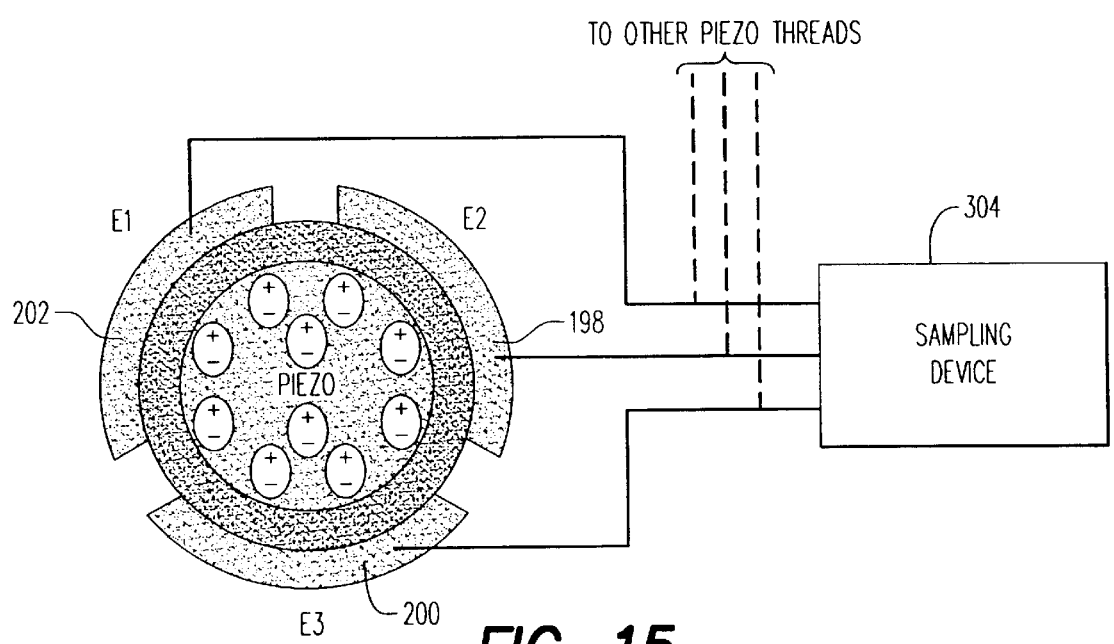
FIG. 15 is a sampling circuit for the active device threads of FIG. 14.

Referring to FIG. 15, by way of example, threads 302B may each be a piezo-electric thread of the type shown in FIG. 9. The electrodes 198, 200 and 202 are connected to a sampling device 304. During a sampling period, sampling device 304 connects voltages between across electrodes 198 and 200, 198 and 202, and 200 and 202 and measures the currents therethrough for comparison with reference values. Dashed lines 306 are for connections to others of the active device lines 302B. For example, all of the active device threads 302B could be sampled together or at separate sampling periods.

Figure 16:
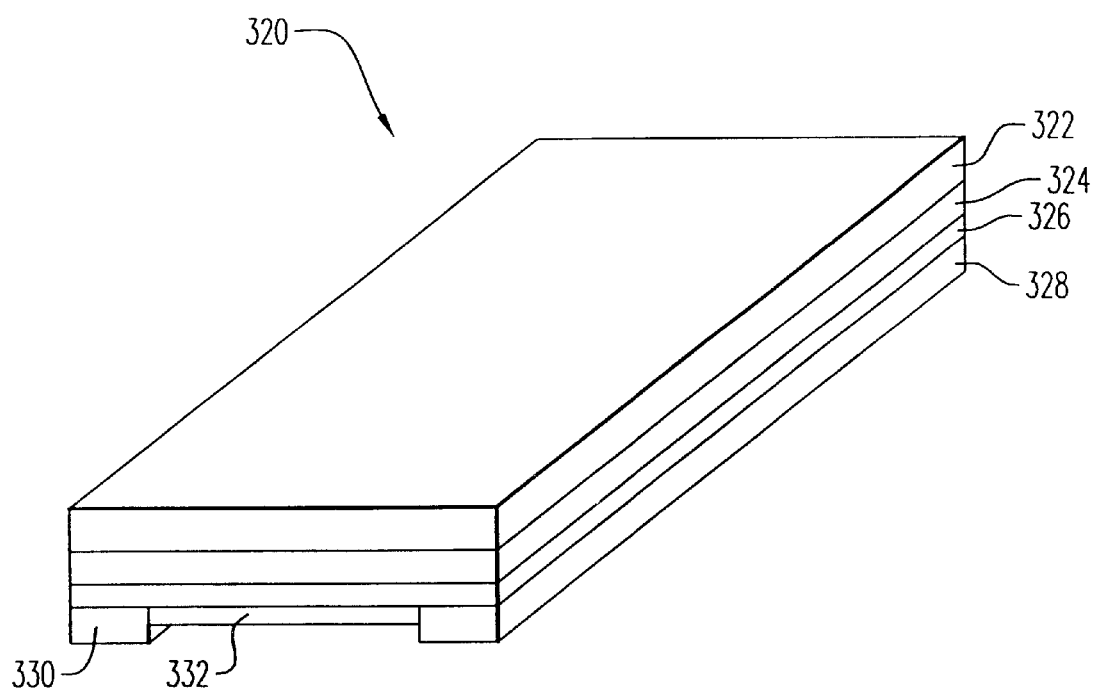
FIG. 16 is a perspective view of an alternate active device of the present invention.

Referring to FIG. 16, an active device 320 has a flexible ribbon substrate 322, a layer 324, a layer 326, a pair of electrical conductors 328 and 330 and a semiconductor body 332. Flexible substrate 322 may be formed of any plastic or metallic material having the characteristics of being pliable or bendable.

For a FET, substrate 322 is electrically conductive and layer 324 is also electrically conductive and forms the gate. Layer 326 is an electrical insulator. Electrical conductors 328 and 330 are the source and drain, respectively. For an optical active device, gate layer 324 is omitted and layer 326 is a light transmissive element, such as a light transmissive waveguide, a prism and the like that transmits light to semiconductor body 332.

For a FET, flexible substrate 322 is preferably a flexible insulated material, such as insulated metal foil, plastics, anodized aluminum, kapton, mylar, cloth, rubber and the like. Layer 324 is any metal that is suitable for a FET gate, such as: aluminum, gold, chrome, and the like. Layer 326 is any suitable gate organic insulator, such as polymethylmethacrylate (PMMA), polyimide, epoxies, and the like; inorganic insulator, such as silicon dioxide, silicon nitride, barium strontium titanates, and the like; or organic/inorganic hybrid, such as sol gel and silicates.

For an optically active device, the flexible substrate is preferably a light transmissive material, such as epoxy, polyimide, polystyrene, mylar, plexiglass, PMMA and the like. Layer 326 is preferably an insulating light transmissive material, such as silicon dioxide, PMMA, and the like. Metal gate layer 326 is preferably a transparent metal, such as indium tin oxide.

For either the FET or the optically active device case, semiconductor body 332 is a layer of organic semiconductor or of a hybrid organic/inorganic material. Suitable organic semiconductor materials include, for example, semiconducting small molecules, oligomers and polymers. For, example, semiconductor body 332 may be formed: with organic semiconductors, such as polythiophene derivatives, oligothiophene derivatives and pentacene. A hybrid semiconductor, for example, may be phenethyl ammonium tin iodide. Electrical conductors 328 and 330 may be any suitable metal or conductive plastic.

These semiconductor material, gate material, gate insulator material and electrical conductors may be applied, by any suitable process, such as coating, dip coating from solution, thermal evaporation, screen printing, extrusion, electrodeposition, stamping, molding and the like.

It should be apparent to those skilled in the art that the FETs described herein can use a hybrid semiconductor, such as, phenethyl ammonium tin iodide, without doping in the channel regions or with doping of tin or antimony in contact regions.

The present invention having been thus described with particular reference to the preferred forms thereof, it will be obvious that various changes and modifications may be made therein without departing from the spirit and scope of the present invention as defined in the appended claims.

What is claimed is:

1. An active device comprising a thread, a semiconductor body extending axially along said thread, first and second electrical conductors extending axially along said thread and disposed in electrical contact at spaced apart locations with said semiconductor body, wherein the impedance between the first and second electrical conductors is varied by energy that affects said thread.

2. The active device of claim 1, wherein said thread has a core, and wherein said semiconductor body is a layer that surrounds said core.

3. The active device of claim 2, wherein said core is an optical fiber.

4. The active device of claim 2, wherein said core is a piezo-electric material.

5. The active device of claim 2, further comprising a layer of insulation material disposed between said core and said semiconductor layer, and wherein said core and said first and second electrical conductors are a gate, a source and a drain of a field effect transistor.

6. The active device of claim 1, wherein said thread is a first thread of a plurality of threads, wherein said first and second electrical conductors are second and third ones of said threads.

7. The active device of claim 6, wherein said first thread is an optical fiber.

8. The active device of claim 6, wherein said first thread includes a core that is electrically conductive, and wherein a layer of electrical insulation material is disposed on said core.

9. The active device of claim 8, wherein said semiconductor body is a layer that is disposed on said layer of electrical insulation material.

10. The active device of claim 8, wherein a fourth one of said plurality of threads extends axially of said first thread.

11. The active device of claim 10, wherein said fourth thread is a spacer of insulation material interposed between said second and third threads.

12. The active device of claim 10, wherein said fourth thread includes an electrically conductive core and a layer of electrical insulation material disposed on said core.

13. The active device of claim 10, wherein another semiconductor layer is disposed on the electrical insulation layer of said fourth thread.

14. The active device of claim 6, further comprising first and second contact bodies that have a carrier enhancing capability and that extend axially of said first thread, wherein said first contact body is disposed between and in electrical contact with said semiconductor body and said second thread, and wherein said second contact body is disposed between and in electrical contact with said semiconductor body and said third thread.

15. The active device of claim 14, wherein said second and third threads include first and second cores, respectively, and wherein said first and second contact bodies are disposed on said first and second cores, respectively.

16. The active device of claim 14, wherein said first and second contact bodies are fourth and fifth ones of said plurality of threads.

17. The active device of claim 1, wherein said semiconductor body includes organic semiconductor material.

18. The active device of claim 17, wherein said organic material is a member of the group consisting of: semiconducting small molecules, oligomer and polymers.

19. The active device of claim 17, wherein said organic material is a member of the group consisting of: pentacene, oligothiophene and polythiophene.

20. The active device of claim 1, wherein said semiconductor body includes a hybrid organic/inorganic semiconductor material.

21. The active device of claim 20, wherein said hybrid organic/inorganic semiconductor material is phenethyl ammonium tin iodide.

22. The active device of claim 2, wherein said core includes one or more filaments.

23. The active device of claim 22, wherein said one or more filaments are electrically conductive.

24. The active device of claim 1, wherein said thread is flexible.

25. The active device of claim 6, wherein said plurality of threads is twisted.

26. The active device of claim 6, further comprising means for holding said plurality of threads together.

27. The active device of claim 6, wherein current flow is in a path that includes said semiconductor body and said second and third threads.

28. The active device of claim 1, wherein said core is electrically conductive.

29. A field effect transistor comprising a thread having an electrically conductive core, a layer of electrical insulation disposed axially along said core, a semiconductor body extending axially along said core and disposed adjacent to said layer of electrical insulation, first and second electrical conductors extending axially along said core and disposed in electrical contact with said semiconductor material at spaced apart locations thereof, wherein the electrical impedance between said first and second electrical conductors varies as a function of energy applied to said electrically conductive core.

30. The field effect transistor of claim 29, wherein said thread is a first one of a plurality of threads, wherein said first thread is a gate with said layer of electrical insulation being disposed on the core thereof, wherein a second one and a third one of said threads include said first and second electrical conductors, respectively, and wherein said second and third threads are a source and a drain, respectively.

31. The field effect transistor of claim 30, wherein at least one of said plurality of threads is flexible.

32. The field effect transistor of claim 30, wherein said plurality of threads is twisted into a bundle, and wherein said bundle is flexible.

33. The field effect transistor of claim 30, wherein said semiconductor body includes organic semiconductor material.

34. The field effect transistor of claim 33, wherein said organic material is a member of the group consisting of: semiconducting small molecules, oligomer and polymers.

35. The active device of claim 33, wherein said organic material is a member of the group consisting of: pentacene, oligothiophene and polythiophene.

36. The active device of claim 29, wherein said semiconductor body includes a hybrid organic/inorganic semiconductor material.

37. The active device of claim 36, wherein said hybrid organic/inorganic semiconductor material is phenethyl ammonium tin iodide.

38. The field effect transistor of claim 29, wherein said core includes one or more filaments.

39. The field effect transistor of claim 38, wherein said one or more filaments are electrically conductive.

40. The field effect transistor of claim 30, wherein current flow is in a path that includes said semiconductor body and said second and third threads.

41. An electrical circuit comprising a plurality of threads and at least one body of semiconductor material, wherein said plurality of threads form two or more electrically interconnected active devices.

42. The electrical circuit of claim 41, wherein said semiconductor body is disposed axially of a first one of said plurality of threads, and wherein second and third ones of said plurality of threads are electrically conductive.

43. The electrical circuit of claim 42, wherein said semiconductor body is a first semiconductor body, wherein a second semiconductor body is disposed axially of a fourth one of said plurality of threads, and wherein one of said second and third threads is in electrical contact with both of said semiconductor bodies.

44. The electrical circuit of claim 42, wherein said semiconductor body is a first semiconductor body that extends axially of a first one of said plurality of threads, and wherein a second semiconductor body is disposed axially of a second one of said plurality of threads, wherein each of said threads includes at least one electrical conductor that extends axially thereof, and wherein said first and second threads comprise said two or more active devices.

45. An active device comprising a semiconductor body, a first electrode and a second electrode disposed at spaced apart locations in electrical contact with said semiconductor body, and a substantially planar and flexible substrate that carries said first and second electrodes and said semiconductor body.

46. The active device of claim 45, further comprising a gate electrode and a gate insulator, wherein said flexible substrate also carries said gate electrode and said gate insulator.

47. The active device of claim 45, wherein said semiconductor body is an organic semiconductor, and wherein said organic material is a member of the group consisting of: semiconducting small molecules, oligomer and polymers.

48. The active device of claim 45, wherein said semiconductor body includes an organic semiconductor, and wherein said organic material is-a member of the group consisting of: pentacene, oligothiophene and polythiophene.

49. The active device of claim 45, wherein said semiconductor body includes a hybrid organic/inorganic semiconductor material.

50. The active device of claim 49, wherein said hybrid organic/inorganic semiconductor material is phenethyl ammonium tin iodide.

51. The active device of claim 46, wherein said flexible substrate is a member of the group consisting of metal, electrically conductive polymer and polymer coated with an electrically conductive material.

52. The active device of claim 45, further comprising a light transmissive body that is also carried by said flexible substrate.

53. The active device of claim 45, wherein said flexible substrate is a light transmissive body.

54. A fabric comprising a plurality of threads, wherein at least one of said threads forms an active device that exhibits a change in electrical impedance when subjected to a change in energy.

55. The fabric of claim 54, wherein said energy is electrical energy.

56. The fabric of claim 54, wherein said energy is light energy.

57. The fabric of claim 54, wherein said energy is mechanical energy.

58. The fabric of claim 54, wherein said active device is formed by first, second and third ones of said plurality of threads.

59. The fabric of claim 58, further comprising a semiconductor body extending axially of said first thread and disposed between said second and third threads.

60. The fabric of claim 59, wherein said active device is a first active device, wherein a second active device is formed of fourth and fifth ones of said plurality of threads and of one of said second and third threads, and wherein another semiconductor body extends axially of said fourth thread.

61. The field effect transistor of claim 32, further comprising a sheath of electrically insulating material, wherein said bundle is disposed in said sheath.

* * * * *